(12) United States Patent
Liu et al.

(10) Patent No.: US 9,401,404 B2
(45) Date of Patent: Jul. 26, 2016

(54) SEMICONDUCTOR DEVICE AND FABRICATION METHOD

(75) Inventors: Huiyun Liu, London (GB); Alwyn John Seeds, London (GB); Francesca Pozzi, London (GB)

(73) Assignee: UCL BUSINESS PLC, London (GB)

( * ) Notice: Subject to any disclaimer, the term of this patent is extended or adjusted under 35 U.S.C. 154(b) by 0 days.

(21) Appl. No.: 14/001,260

(22) PCT Filed: Feb. 24, 2012

(86) PCT No.: PCT/GB2012/000190
§ 371 (c)(1),
(2), (4) Date: Oct. 1, 2013

(87) PCT Pub. No.: WO2012/114074
PCT Pub. Date: Aug. 30, 2012

(65) Prior Publication Data
US 2014/0016659 A1    Jan. 16, 2014

(30) Foreign Application Priority Data

Feb. 26, 2011    (GB) .................................. 1103342.0

(51) Int. Cl.
*H01S 5/00*    (2006.01)
*H01L 29/267*    (2006.01)
(Continued)

(52) U.S. Cl.
CPC ........ *H01L 29/267* (2013.01); *H01L 21/02381* (2013.01); *H01L 21/02433* (2013.01); *H01L 21/02463* (2013.01); *H01L 21/02491* (2013.01); *H01L 21/02499* (2013.01); *H01L 21/02505* (2013.01); *H01L 21/02546* (2013.01); *H01L 21/02631* (2013.01); *H01S 5/0218* (2013.01); *H01S 5/3013* (2013.01); *H01S 5/3412* (2013.01); *B82Y 40/00* (2013.01); *H01S 5/0014* (2013.01); *H01S 5/06216* (2013.01); *H01S 5/2036* (2013.01); *H01S 5/22* (2013.01); *H01S 2301/173* (2013.01)

(58) Field of Classification Search
CPC ... H01S 5/3013; H01S 5/0014; H01S 5/0218; H01L 29/267
USPC .......................... 372/45.012; 977/774; 117/90
See application file for complete search history.

(56) References Cited

U.S. PATENT DOCUMENTS 4,786,616 A * 11/1988 Awal et al. ...................... 117/85
5,308,444 A * 5/1994 Fitzgerald et al. ............... 117/90
(Continued)

OTHER PUBLICATIONS

Lopez-Otero, "Hot Wall Epitaxy," Thin Solid Films, 49, pp. 3-55, 1978.*
Fitzgerald, et al., "Necessity of Ga Prelayers in GaAs/Ge Growth Using Gas-Source Molecular Beam Epitaxy", Applied Physics Letters, vol. 64, No. 6, Feb. 7, 1994, pp. 733-735.
(Continued)

*Primary Examiner* — Tuan Nguyen
(74) *Attorney, Agent, or Firm* — Kenneth H. Sonnenfeld; King & Spalding LLP

(57) ABSTRACT

A semiconductor device is disclosed comprising: a substrate having a surface comprising germanium; a layer of gallium on said surface; and a layer of gallium arsenide on the gallium covered surface. The semiconductor heterostructure of gallium arsenide on germanium is fabricated by the steps of: protecting by a shutter a surface comprising germanium in an environment having a partial pressure of arsenic less than $10^{-8}$ torr; epitaxially growing a layer of gallium on the said surface immediately after exposure of said surface; and epitaxially growing a layer of gallium arsenide on the gallium covered surface.

6 Claims, 3 Drawing Sheets

(51) Int. Cl.
  *H01L 21/02* (2006.01)
  *H01S 5/02* (2006.01)
  *H01S 5/34* (2006.01)
  *H01S 5/30* (2006.01)
  *H01S 5/062* (2006.01)
  *H01S 5/20* (2006.01)
  *H01S 5/22* (2006.01)
  *B82Y 40/00* (2011.01)

(56) References Cited

U.S. PATENT DOCUMENTS 6,876,010 B1* 4/2005 Fitzgerald ............... 257/191
2006/0246700 A1* 11/2006 Johnson ................ 438/606

OTHER PUBLICATIONS

Huiyun Liu et al., "Long-Wavelength InAs/GaAs Quantum-Dot Laser Diode Monolithically Grown on Ge substrate," Nature Photonics, vol. 5, Jul. 2011 pp. 416-418.

Kuo, et al., "Gas-Source Molecular-Beam Epitaxy of InGaP and GaAs on Strained-Relaxed $Ge_xSi_{1-x}$/Si," Journal of Vaccum Science and Technology: Part B, vol. 11, No. 3, May 1993, pp. 857-860.

UCL Buisness PLC, "Notification of Transmittal of the International Search Report and the Written Opinion of the International Searching Authority, or the Declaration for PCT/GB2010/000190," May 2, 2012, 5 pages.

Lopez-Otero, "Hot Wall Epitaxy," Thin Solid Films, 49, pp. 3-57, 1978.

* cited by examiner

SEMICONDUCTOR DEVICE AND FABRICATION METHOD

The present invention relates to a semiconductor device and a method of fabrication thereof, in particular relating to III-V compounds grown on germanium.

Incorporating photonic components into silicon microelectronics has been the impetus behind the development of Si photonics for the last 20 years. Although Si-based light generation and modulation technologies have been explored extensively, a Si-based laser has been considered as the holy grail of silicon photonics because (i) it is the most important active photonic device, (ii) the potential payoff is most significant, and (iii) it is one of the most difficult challenges to realize among all the Si photonic components. Si and Ge have an indirect band structure, which means radiative recombination events do not occur frequently and accordingly, radiative recombination processes for emitters are insignificant compared to non-radiative recombination. Direct band-gap III-V compounds have robust photonic properties that can be utilised for many photonics applications. Integrating III-V photonic components with Si microelectronics would thus provide the ideal solution for Si photonics. To date, the most successful approach to the realisation of high performance III-V lasers on silicon has been hybrid integration using wafer bonding, which has yielded devices capable of operating at substrate temperatures up to 60° C. However, despite research activities stretching back over 20 years, the direct monolithic integration of III-V lasers on Si substrates continues to present huge implementation challenges.

The main challenge in realising III-V devices on Si stems from the formation of two types of defects; anti-phase boundaries (APBs) and threading dislocations (TDs). The most severe problem in III-V on Si integration is the formation of high-density TDs due to the lattice mismatch between III-V compounds and Si. TDs are well known to act as non-radiative recombination centres and to promote dark line defects in the operation of semiconductor laser diodes, hence reducing optoelectronic conversion efficiency and device lifetime, while increasing the drive current. To avoid the formation of TDs, an alternative to direct growth of GaAs on Si substrate is to use an intermediate epitaxial layer, which creates a near-GaAs lattice constant but has few defects. Because the Ge lattice constant is very closely lattice-matched (only 0.08% mismatch) to GaAs, Ge-coated Si layers have been widely employed as an ideal "virtual substrate" for subsequent GaAs growth. Several techniques for minimizing the TD density in the Ge layer have become well established. Note that as the scaling of Si microelectronics devices approaches the 22 nm node, Ge epilayers replace Si as p-channel materials in complementary metal-oxide-semiconductor (CMOS) devices on Si substrates, due to Ge's much higher hole mobility than that of Si. Therefore, the major challenge for incorporating III-V photonic components into future Si microelectronics is to fabricate III-V layers directly on Ge/Si, instead of directly on a Si substrate. However, III-V laser diodes have not become well established on Ge/Si or Ge substrates so far because of the formation of APB defects. III-V compound materials are composed of two different atomic sublattices. Sublattice shift may nucleate during epitaxial growth of III-V on Si or Ge. Sheets of wrong nearest neighbour bonds, i.e., APB can occur. APBs are planar defects, which debilitate device performance by acting as nonradiative recombination centres. Some of the TDs generated at the Ge/Si virtual substrates and APB generated at the III-V/Ge interface will propagate through the III-V layers. For conventional III-V quantum well (QW) devices, any TD or APB propagating through the QWs will become a nonradiative recombination centre, and hence degrade the whole device performance, leading to a high threshold current density for III-V QW laser diodes on Ge and Si substrates.

In the past decade, III-V quantum clot (QD)—semiconductor nanosize crystal—lasers have been demonstrated with a significantly lower threshold current density than traditional semiconductor QW lasers and offering temperature-insensitive operation above room temperature. Furthermore, QD structures offer other unique advantages over conventional QWs for semiconductor laser diodes, including lower sensitivity to defects and filtering the APBs and TDs. In the case of relatively high TD density in the active region, one TD in the active region can only "kill" one or a few dots. It will not affect the majority of dots, and hence will not significantly degrade the performance of QD devices on Ge or Si substrates. These novel attributes of QD technology are very promising for the development of III-V QD lasers on Ge substrates, hence on Ge/Si substrates. Recently, the growth of InAs/GaAs QD epitaxial materials on a Ge substrate has been demonstrated. However the emission of Ge-based InAs/GaAs QDs is only at around 1.1 μm wavelength below room temperature, and there has been no prior report on the realisation of laser diodes.

The present invention seeks to alleviate, at least partially, some or any of the above problems.

According to one aspect of the present invention there is provided a method of fabricating a semiconductor heterostructure of gallium arsenide on germanium comprising the steps of:

protecting by a shutter a surface comprising germanium in an environment having a partial pressure of arsenic less than $10^{-8}$ torr;

epitaxially growing a layer of gallium on the said surface immediately after exposure of said surface; and epitaxially growing a layer of gallium arsenide on the gallium covered surface.

According to another aspect of the present there is provided a semiconductor device comprising:

a substrate having a surface comprising germanium;

a layer of gallium on said surface; and a layer of gallium arsenide on the gallium covered surface.

Preferably, the semiconductor device is fabricated according to the method of the invention.

Embodiments of this invention stem from the finding that during the process of fabricating semiconductor devices based upon III-V compounds, the shutter covering a germanium surface can be used to block arsenic, thus producing a drastic change in the step structure of the germanium surface in an environment with arsenic in the background. Initiation of gallium arsenide with the typical procedure of using self-terminating As layer produces poor gallium arsenide surface morphology due to antiphase domains, even with large miscut of the (100) surface, for example 6° off cut substrates. Initiation of gallium arsenide growth with approximately 1 monolayer of gallium, i.e., gallium prelayer results in a very much smoother surface morphology for the gallium arsenide layer. However, germanium will be terminated with arsenic from the background arsenic pressure during the preparation of the germanium epitaxial layer, such as dioxide and annealing processing, prior to the deposition of the gallium prelayer. To prevent arsenic deposition, the shutter directly covering the germanium is applied until just before depositing gallium. This approach yields a surface substantially free of arsenic. Gallium is then deposited on the surface followed by the growth of a layer of gallium arsenide. The improved method has been employed to make III-V laser diodes on germanium substrates with very low threshold current density at room temperature and can be used for the fabrication of a wide range of other electronic and opto-electronic devices.

Embodiments of the invention will now be described, by way of example only, with reference to the accompanying drawings in which:

FIGS. 1(a) and 1(b) show atomic force microscope images of the surface morphology for GaAs grown on a Ge substrate for (a) comparative example and (b) according to an embodiment of the invention;

Figure 4:
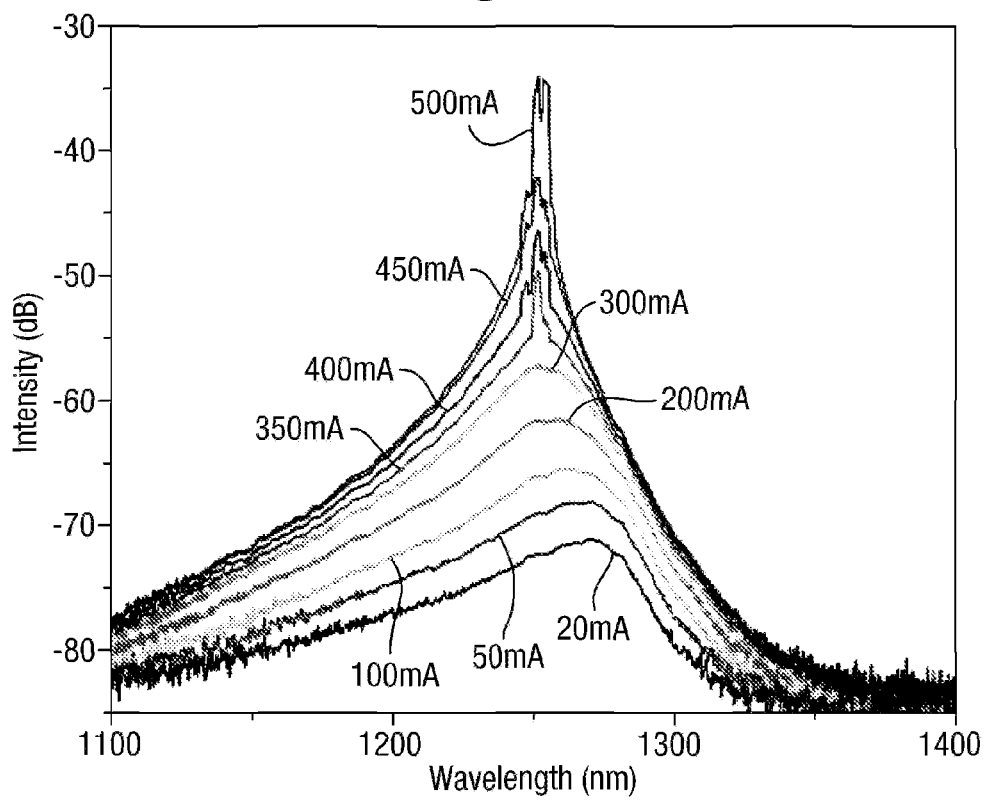
Figure 5A:
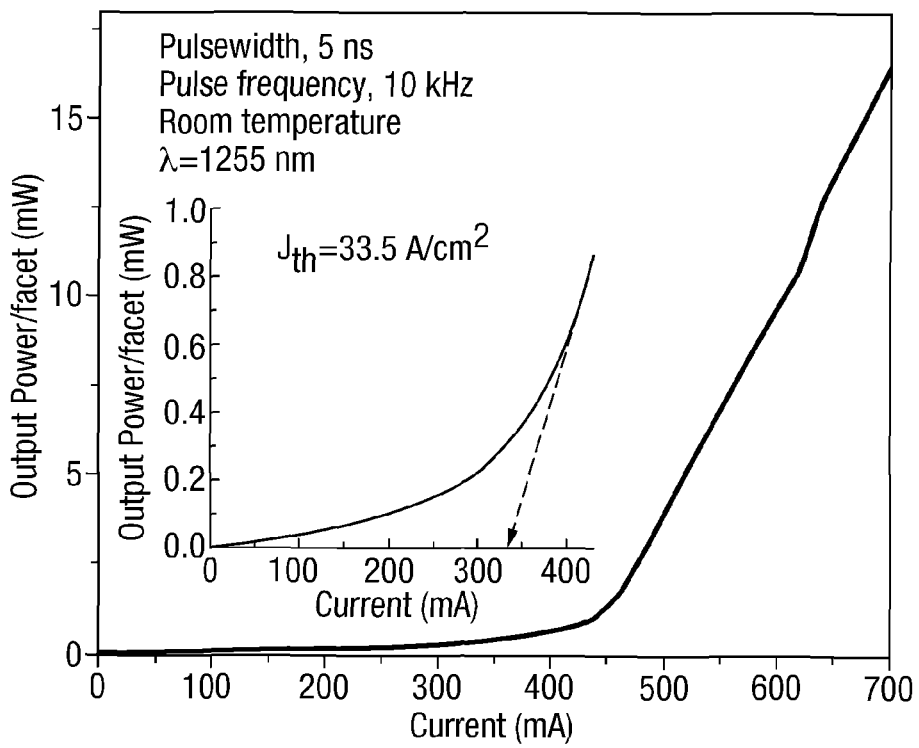
Figure 5B:
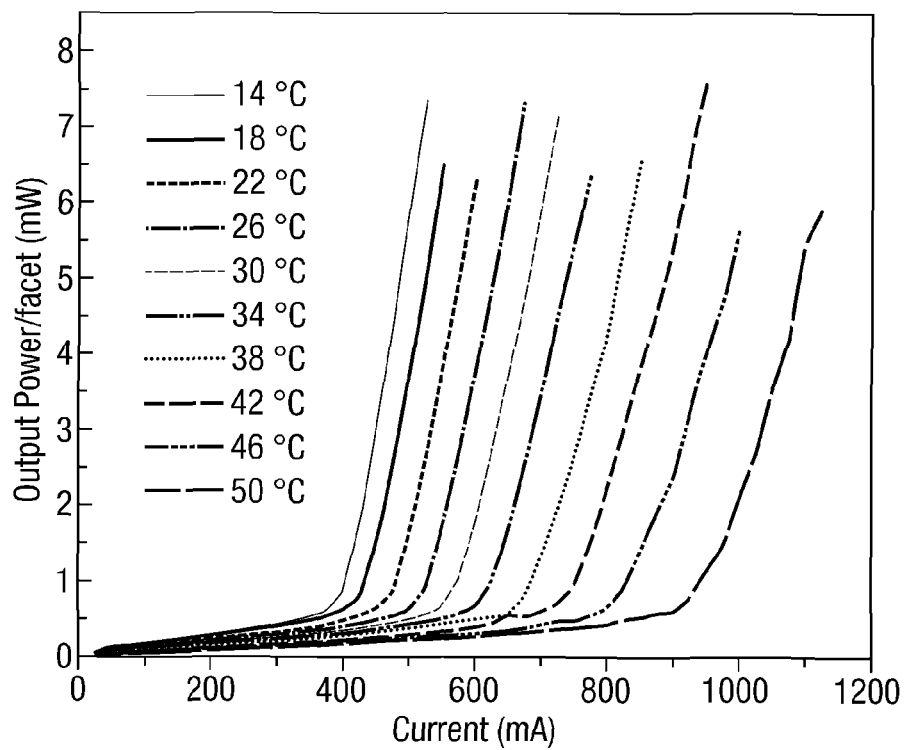

FIG. 4 shows room-temperature emission spectra for a quantum dot laser at different drive currents; and FIGS. 5(a) and 5(b) show plots of light output power against current for quantum dot laser diodes, with 5(a) being at room temperature and 5(b) showing results for a range of various substrate temperatures.

Figure 1A:
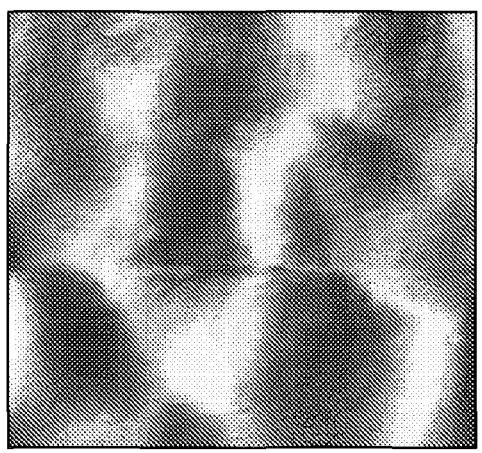
Figure 1B:
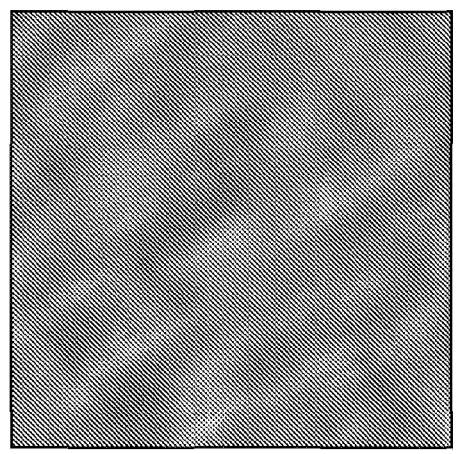

Here, we describe the first III-V QD laser diode on a Ge substrate. Solid-source molecular beam epitaxy (MBE) growth of GaAs buffer layers on (100) Ge (GaAs/Ge) substrates, off-cut 6° towards the [111] plane was performed with an As initial layer (comparative example) or Ga initial layer (embodying the invention). FIGS. 1(a) and 1(b) are 5×5 μm² atomic force microscopy (AFM) images of the surface morphology for 1.2 μm GaAs buffer layer on Ge substrates with As prelayer (a) and Ga prelayer (b) growth techniques. Initiation of GaAs with the typical procedure of using self-terminating As layer produces poor GaAs surface morphology due to APBs, see FIG. 1(a), despite the large miscut of the (100) surface. However, initiation of GaAs growth with approximately 1 monolayer of Ga, i.e., Ga prelayer results in a very much smoother surface morphology for the GaAs layer, see FIG. 1(b), which indicates the formation of a single-domain GaAs buffer layer on Ge substrate.

Figure 2:
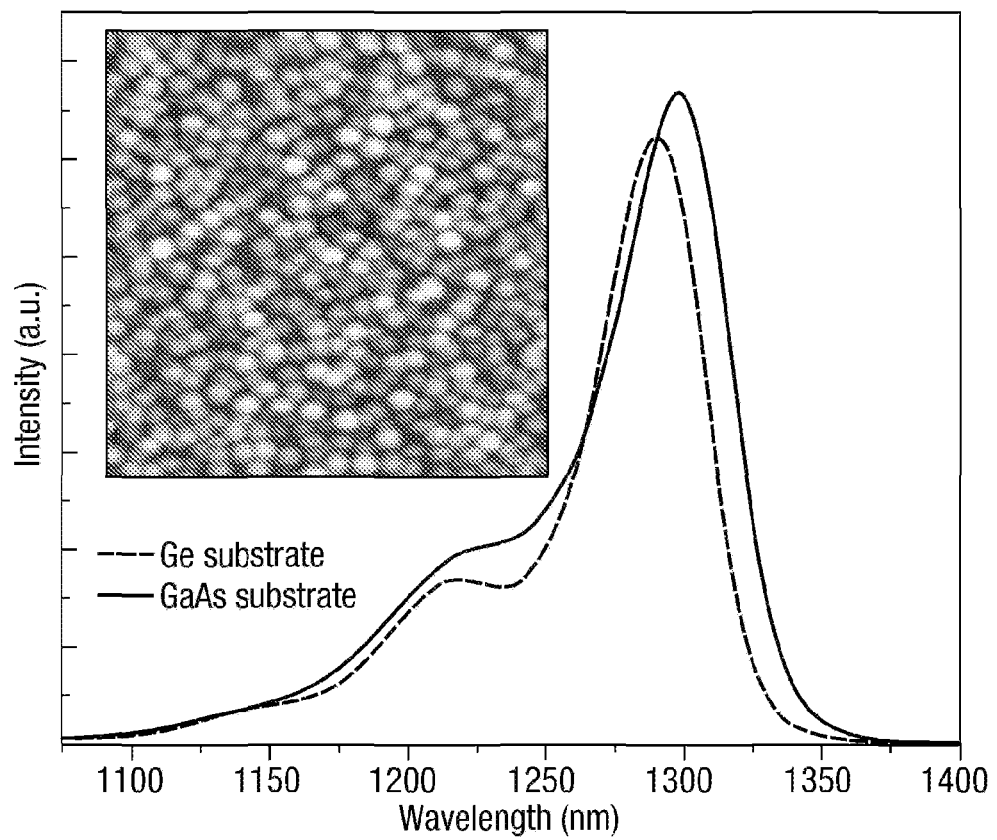
FIG. 2 shows photoluminescence spectra, and an inset atomic force microscope image, for quantum dot structures.

Next, an InAs/InGaAs dot-in-a-well (DWELL) structure was fabricated on the single-domain GaAs buffer layer. The inset of FIG. 2 shows the 1×1 μm² Atomic Force Microscopy (AFM) image of the uncapped InAs QDs grown on GaAs/Ge, from which a QD density of about $4.5 \times 10^{10}$ cm$^{-2}$ is obtained. The InAs QDs randomly distribute on the surface, as on GaAs(100) substrates. This morphology of InAs QDs is significantly different to that of InAs QDs grown on a Ge-on-insulator-on-Si substrate by metal organic chemical vapor deposition, in which APBs were observed and the InAs QDs were lined with a preferential orientation along [110] direction with bimodal size distribution. FIG. 2 compares the room-temperature photoluminescence (PL) spectra of the capped InAs QDs grown on Ge and GaAs substrates. The InAs QD PL intensity on the Ge substrate is almost identical to that of QDs grown on a GaAs substrate, and used for the fabrication of high-performance 1300-nm InAs/GaAs QD lasers with extremely low threshold current density. The ground-state emission of the QDs grown on the Ge substrate takes place at 1291 nm, and the peak yields a full width at half maximum (FWHM) of 29.8 meV. The FWHM is remarkably narrow, and close to the state-of-the-art value for QDs on GaAs substrates.

Figure 3:
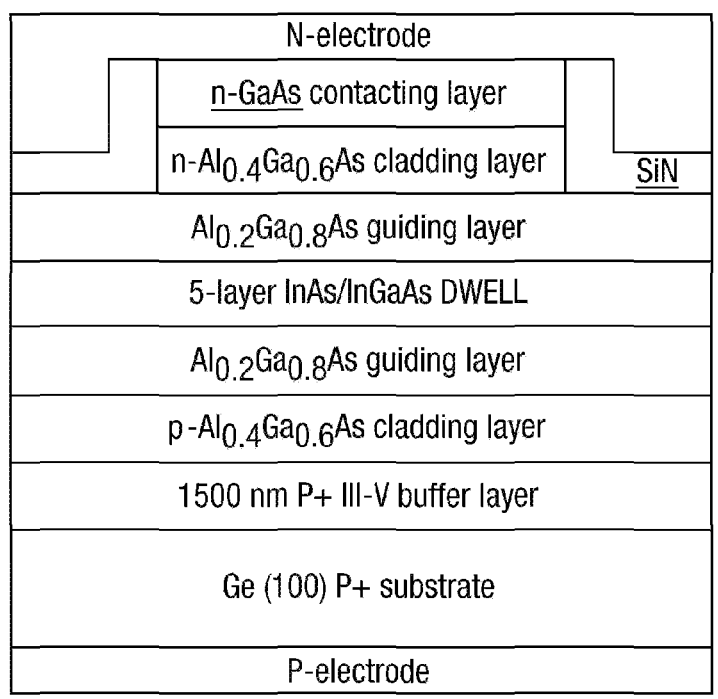
FIG. 3 illustrates schematically the layer structure for an InAs quantum-dot laser diode.

Standard 5-layer 1300-nm InAs/InGaAs DWELL lasers (quantum-dot laser diode) were fabricated on the GaAs/Ge substrate. The device structure is shown in FIG. 3. The cladding layers are typically 1.5 μm thick, the guiding layers 55 nm thick, and the contacting layer 300 nm thick. Broad-area devices with cavities of width 100 μm and length 10 mm were fabricated with as-cleaved facets. FIG. 4 shows a series of room-temperature spontaneous and lasing emission spectra of these QD laser diodes operating below and above threshold (the lowest curve corresponding to the lowest current, and the intensity increasing with increasing current value). The laser diode was driven in pulsed-current mode with a pulse duration of 5 ns and a repetition frequency of 10 kHz. Spontaneous emission can be observed at a peak wavelength of approximately 1270 nm with FWHM of 38 meV at a current of 20 mA. The peak of the spontaneous emission shifts to shorter wavelength and becomes narrower with increasing injection current. This is due to the gain saturation of the bigger dots emitting at longer wavelength. Lasing emission with peak wavelength of 1255 nm can be observed at a current of 350 mA, as shown FIG. 4. On increasing the injection current, the lasing peak emission slightly shifts to longer wavelength with multimode spectra appearing. This redshift of lasing wavelength could be related to the poor thermal resistance of this device, because the laser diode was tested without substrate bonding, thinning and heat-sinking.

FIG. 5(a) shows the device light output power against current characteristics at room temperature. The measured output power from one facet is close to 17 mW for an injection current of 700 mA, with no evidence of power saturation up to this current. The differential external quantum efficiency for the output power from both facets was estimated to be 10.4% between the injection currents of 350 and 450 mA, and 70.6% for above 500 mA. These output characteristics are comparable with previous reports on long-wavelength InAs QD lasers grown on GaAs substrates. The inset shows that the lasing threshold is 335 mA. The threshold current density ($J_{th}$) normalized by the device area, is 33.5 A/cm², which corresponds to about 6.7 A/cm² for each of the five QD laser layers. This extremely low $J_{th}$, is comparable to the best-reported values for GaAs-based multilayer InAs QD lasers. For example, 40 A/cm² for 2-QD-layer broad area lasers were obtained for GaAs-based InAs QD laser diodes with as-cleaved facets and in pulsed operation and 33 A/cm² for 7-QD-layer ridge-waveguide lasers. The threshold current densities of InAs/GaAs QD laser diodes are very sensitive to the defects within the active region and within the cladding layers. The extremely low threshold current density obtained for the Ge-based InAs/GaAs QD laser here clearly indicates that the defects generated at the GaAs/Ge interface and within the III-V buffer layer are extremely low, and hence that the quality of the GaAs buffer layer grown on the Ge substrate is very high. FIG. 5(b) shows the device output power per facet for various substrate temperatures, ranging from 14 to 50° C. (plots shift from left to right as temperature increases). The laser has a 50° C. maximum lasing temperature with a characteristic temperature of about 45 K. Note that techniques for fabricating low-defect Ge buffer layers on Si substrates have been systematically developed and high-quality Ge/Si wafers are commercially available. A next step towards developing long-wavelength InAs/GaAs QD lasers on Si substrates could be achieved by growing the laser structure on Ge/Si substrates. Here, it should be mentioned that although an epitaxially grown Ge/Si laser operating at room temperature has recently been demonstrated by using tensile strain and n-type doping, it was pumped optically.

Embodiments of the invention have demonstrated the first operation of quantum-dot laser diodes epitaxially grown on Ge substrates. A high-quality GaAs buffer layer with very smooth surface and extremely low defect density has been fabricated by using a Ga prelayer growth technique. Room-temperature lasing at 1255 nm has been observed with an output power of 17 mW per facet and an extremely low threshold current density of 33.5 A/cm² for a five-layer QD device. This study is an essential step toward the monolithic integration of long-wavelength InAs/GaAs QD lasers on a Ge/Si substrate, as well as that of other III-V devices through fabricating III-V devices on Ge/Si substrates.

Detailed Methods

Crystal growth. The epitaxial materials were fabricated by solid-source III-V Molecular Beam Epitaxy. P-doped (100)-orientated Ge substrates with 6° offcut towards the [111] planes were used in our experiments. Oxide desorption was performed by holding the Ge substrate at a temperature of 400° C. The substrate temperature was then increased to 650° C. and held at that temperature for 20 minutes. The Ge substrate was then cooled to 380° C. for the growth of III-V epitaxial layers. For the Ga prelayer, the base pressure was reduced to below $10^{10}$ Torr in the MBE growth chamber before loading the Ge wafer into the growth chamber. To ensure total Ga coverage on the Ge substrate, 1.08 monolayer Ga was first deposited. Otherwise, the Ge surface will be terminated with As by opening the valve of As cracker for 1 minute. After either As or Ga prelayers were deposited, 20 monolayer of GaAs were grown by migration enhanced epitaxy using alternating Ga and $As_4$ beams, and then addition of the III-V buffer layer at higher temperature. QD laser devices containing five InAs/InGaAs DWELL layer were then grown at optimized conditions as on GaAs substrates, with each layer consisting of 3.0 monolayers of InAs grown on 2 nm of $In_{0.15}Ga_{0.85}As$ and capped by 6 nm of $In_{0.15}Ga_{0.85}As$. 45 nm GaAs barriers separated the five DWELLs with outer 70 nm GaAs and 55 nm $Al_{0.2}Ga_{0.8}As$ layers completing the waveguide core. Cladding layers consisted of 1.5 µm $Al_{0.4}Ga_{0.6}As$ grown at 620° C. A 300-nm $n^+$-GaAs contact layer completed the growth. The growth temperature was 580° C. for GaAs, and 510° C. for the In-containing layers.

Device fabrication. Broad-area laser devices were formed with a shallow ridge etch after depositing the Al contact layer on the bottom of the chip. The wet chemical etching was stopped when the upper n-doped GaAs and AlGaAs layers were removed to a depth of 1.8 µm. The broad area devices studied here are of 100 µm width. A 500 nm thick layer of $SiN_x$ was deposited on the sample surface and contact windows opened on the ridge top, followed by deposition of the TiAu contact layer. Devices of 10-mm length were tested without any mounting and bonding.

Measurements. AFM measurements were performed with a Nanoscope Dimension™ 3100 SPM AFM system in ambient conditions using a noncontact mode. Photoluminescence (PL) measurements were performed at room temperature with a solid state laser, emitting at 532 nm. The PL emission was detected using a cooled germanium detector. Laser device characteristics were measured in pulsed mode using a pulse duration of 5 ns and a repetition frequency of 10 kHz.

The invention claimed is:

1. A method of fabricating a semiconductor heterostructure of gallium arsenide on germanium comprising the steps of:
    protecting a surface comprising germanium by a shutter covering the surface in an environment having a partial pressure of arsenic that is less than $10^{-8}$ torr;
    epitaxially growing a layer of gallium on the surface immediately after opening the shutter to expose the surface; and
    epitaxially growing a layer of gallium arsenide on the gallium covered surface;
    wherein the shutter is positioned directly covering the surface to keep the surface substantially free of arsenic prior to the step of epitaxially growing a layer of gallium;
    wherein said germanium surface is a (001) oriented germanium substrate off-cut by between 1° and 6° towards the [110] direction,
    wherein a further heterostructure comprises at least one quantum dot on a substrate comprising a germanium layer or germanium-silicon alloy layer on a silicon substrate; and
    wherein the quantum dot is between an upper cladding layer and guiding layer and a lower cladding layer and guiding layer.

2. The method of claim 1, wherein a monolayer or more of gallium is grown on said germanium surface.

3. The method of claim 1, wherein said further heterostructure comprising gallium, indium, aluminum, and arsenic is grown on said gallium arsenide layer.

4. The method of claim 1, wherein said epitaxial growth is effected by molecular beam epitaxy.

5. The method of claim 1, wherein said epitaxial growth is effected by chemical vapor deposition.

6. The method of claim 1, wherein said germanium surface is a germanium-silicon alloy comprising from 70% to 100% germanium.

* * * * *